(12) United States Patent
Heil

(10) Patent No.: US 8,204,619 B2
(45) Date of Patent: Jun. 19, 2012

(54) BUILDING CONSTRUCTION SOFTWARE AND SYSTEM

(76) Inventor: Duane A. Heil, Arroyo Grande, CA (US)

( * ) Notice: Subject to any disclaimer, the term of this patent is extended or adjusted under 35 U.S.C. 154(b) by 338 days.

(21) Appl. No.: 12/549,220

(22) Filed: Aug. 27, 2009

(65) Prior Publication Data

US 2011/0054652 A1 Mar. 3, 2011

(51) Int. Cl.
*G06F 19/00* (2006.01)
*G06F 17/50* (2006.01)
*G05B 19/18* (2006.01)

(52) U.S. Cl. .................. 700/182; 700/98; 700/116

(58) Field of Classification Search .............. 700/97, 700/98, 110, 116, 159, 182, 207; 703/1, 703/6, 7; 715/753

See application file for complete search history.

(56) References Cited

U.S. PATENT DOCUMENTS

| | | | |
|---|---|---|---|
| 4,876,787 A * | 10/1989 | Ditty et al. | 29/430 |
| 5,365,705 A * | 11/1994 | Crowley et al. | 52/90.1 |
| 5,640,812 A * | 6/1997 | Crowley et al. | 52/90.1 |
| 5,765,330 A * | 6/1998 | Richard | 52/309.13 |
| 5,803,964 A * | 9/1998 | Scarborough | 106/724 |
| 5,865,001 A * | 2/1999 | Martin et al. | 52/309.12 |
| 6,263,628 B1 * | 7/2001 | Griffin | 52/309.12 |
| 6,438,922 B1 * | 8/2002 | DeLeFevre | 52/741.1 |
| 6,721,684 B1 * | 4/2004 | Saebi | 702/183 |
| 6,912,488 B1 * | 6/2005 | Saebi | 703/1 |
| 6,985,832 B2 * | 1/2006 | Saebi | 702/189 |
| 7,010,544 B2 * | 3/2006 | Wallen et al. | 707/791 |
| 7,779,600 B1 * | 8/2010 | Saebi | 52/745.19 |
| 7,788,879 B2 * | 9/2010 | Brandes et al. | 52/838 |
| 7,793,400 B2 * | 9/2010 | Arnold, Jr. | 29/411 |
| 7,803,467 B2 * | 9/2010 | Dorsy | 428/596 |
| 7,954,292 B2 * | 6/2011 | Holt et al. | 52/309.8 |
| 2002/0020141 A1 * | 2/2002 | Payer | 52/741.11 |
| 2004/0204903 A1 * | 10/2004 | Saebi | 702/167 |
| 2004/0221529 A1 * | 11/2004 | Zornes | 52/311.1 |
| 2005/0257494 A1 * | 11/2005 | Brandes | 52/782.1 |
| 2006/0117689 A1 * | 6/2006 | Onken et al. | 52/309.7 |
| 2006/0191232 A1 * | 8/2006 | Salazar et al. | 52/606 |
| 2006/0283119 A1 * | 12/2006 | Beroz et al. | 52/405.3 |
| 2007/0256387 A1 * | 11/2007 | Dorsy | 52/588.1 |
| 2007/0260345 A1 * | 11/2007 | Mifsud et al. | 700/97 |
| 2007/0261318 A1 * | 11/2007 | Mifsud et al. | 52/79.1 |
| 2007/0262040 A1 * | 11/2007 | Mifsud et al. | 212/324 |
| 2007/0265724 A1 * | 11/2007 | Mifsud et al. | 700/115 |
| 2007/0271073 A1 * | 11/2007 | Mifsud et al. | 703/1 |
| 2007/0271870 A1 * | 11/2007 | Mifsud et al. | 52/745.2 |
| 2009/0056245 A1 * | 3/2009 | Miller | 52/188 |
| 2009/0125283 A1 * | 5/2009 | Conover | 703/1 |
| 2010/0199572 A1 * | 8/2010 | Fimbel et al. | 49/506 |

* cited by examiner

*Primary Examiner* — Charles Kasenge
(74) *Attorney, Agent, or Firm* — Law Office of Thomas E. Schatzel, A Prof. Corp.

(57) ABSTRACT

A method of building construction includes designing a building with software for execution on a computer such that an envelope of the building principally comprises expanded polystyrene foam panels, and the software is used to automatically generate a plan with reference numbers that identify substantially all the component pieces of the building. The software and computer are coupled to a computer aided design (CAD) program for generating computer numerical controlled (CNC) milling commands for expanded polystyrene foam panels, and a cut-list for steel reinforcing studs to fit into matching slots milled into the expanded polystyrene foam panels. At least the expanded polystyrene foam panels and matching steel reinforcing studs are marked with identifying numbers corresponding to the reference numbers. The expanded polystyrene foam panels are milled with a CNC machine and panel cutter according to CNC milling commands from the CAD program.

10 Claims, 4 Drawing Sheets

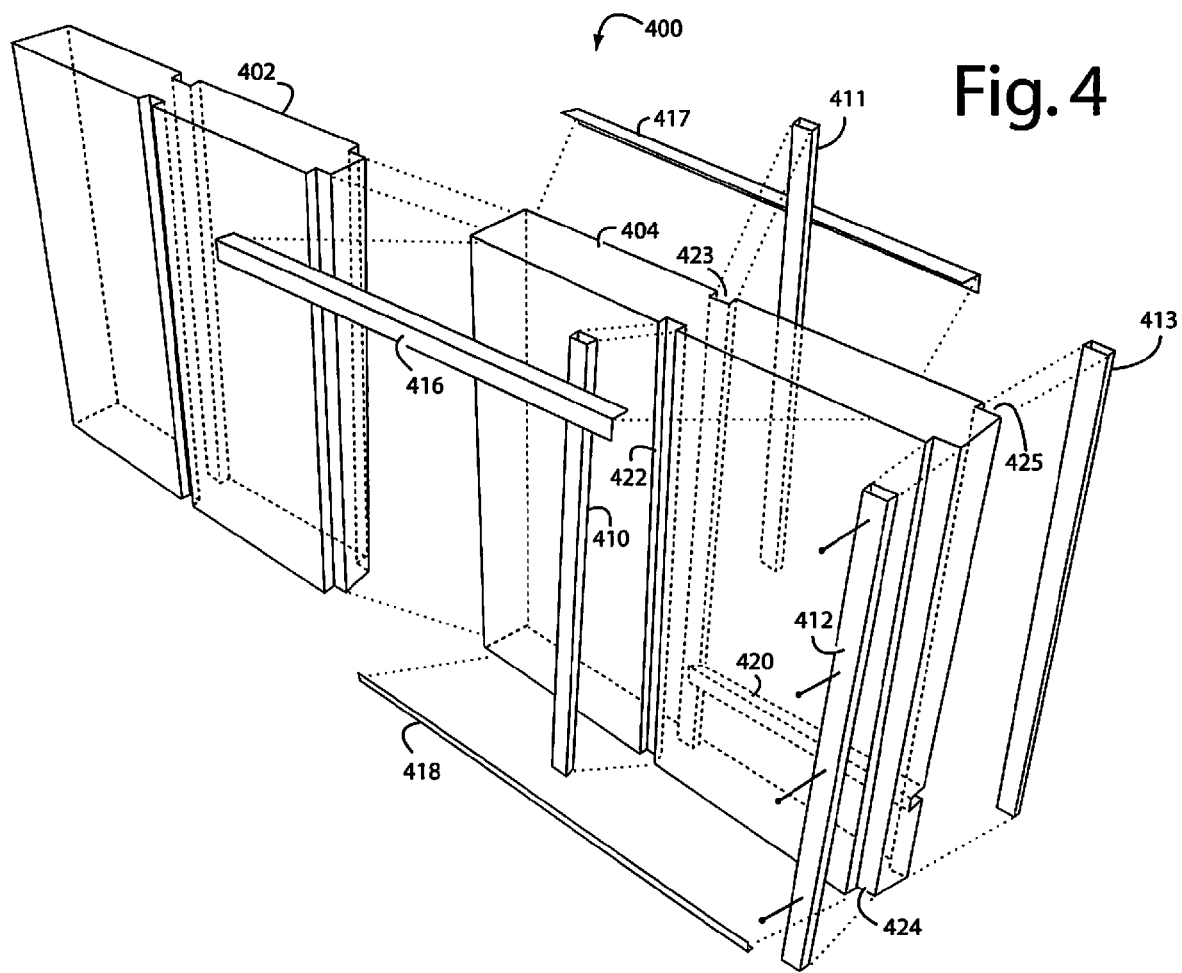

BUILDING CONSTRUCTION SOFTWARE AND SYSTEM

BACKGROUND OF THE INVENTION

1. Field of the Invention

The present invention relates to construction and design tools, and in particular to computer programs and systems for designing buildings, generating accurate cut-lists, cutting and assembling materials, and reducing environmental waste.

2. Description of the Prior Art

The process of building construction has conventionally been a single file march of developers, architects, engineers, government, contractors, and material suppliers that operate in a sequential then pseudo collaborative fashion. This siloed, head-to-toe approach often leads to inefficiencies. Rough plans, with the details left open, lead to various interpretations, on-site decision making, and wasteful construction that is not environmentally friendly. It also limits the ability to optimize building scale and timing. Very often persons involved face unexpected results, and exceed costs. Conventional building methods commonly include miscommunication, waste, errors, litigation, and excess costs.

Conventional home and industrial building construction have commonly been done from plans manually drawn by architects and engineers. The simplest of these are just detailed enough to get government building department approvals for permits and for the contractors and subcontractors to be able to generate their own bills of materials, cut-lists, and labor estimates. Such buildings are made out of standard sized materials, like 4'×8' plywood sheets, and 2"×4"×8' studs. Cut-lists are generated by the craftsmen on-site, as pieces are needed. Inevitably, a lot of material is wasted, and many times the cuts are wrong, leading to more waste. The bills of materials too, are at best estimates, and too much material being ordered lead to more waste and too little material cost time.

The use of computers and computer aided design (CAD) leads to better drawings with more detail, and more accurate bills of material. Piece details are more common, but no guarantee that the pieces will all fit together. This stage of development still very much depends on the trades-people being able to catch any ordering and material cutting mistakes. But since the mistakes made are often very subtle, the mistakes are not discovered until much later in the construction. Correcting the mistakes commonly involves some reconstruction, and more than the expected amount of material.

A far better building practice is to have a complete design from the start, and all the necessary materials pre-cut and identified as to their use. With the proper use of well programmed computers, mistakes in cutting and marking can be very tightly controlled. In using such, if a trades-person finds that the computer indicates that the pieces will not fit, then a solution does not involve wasting a pre-cut piece.

Building information modeling (BIM) is an integrated process that allows architects, engineers, and builders to explore a project digitally before it is built. Coordinated, reliable information is used throughout the process to design innovative projects, more accurately visualize appearance for better communication, and simulate real-world performance for better understanding of important characteristics such as cost, scheduling, and environmental impact.

SOLIDWORKS is a three-dimensional (three-dimensional) mechanical CAD software program that runs on Microsoft WINDOWS and is developed by Dassault Systems SOLIDWORKS Corp., in France. SOLIDWORKS, is not specifically designed for working with standard building materials in the construction of homes and industrial buildings. This much of what is provided in the standard software product is not useable or does not fit the job very well.

SOLIDWORKS is a parasolid-based solid modeler, and uses a parametric feature-based approach to create models and assemblies. See, http://en.wikipedia.org/wiki/SolidWorks. Parameters refer to constraints whose values determine the shape or geometry of the model or assembly. Parameters can be either numeric parameters, such as line lengths or circle diameters, or geometric parameters, such as tangent, parallel, concentric, horizontal or vertical, etc. Numeric parameters can be associated with each other through the use of relations, which allows them to capture design intent.

A design intent is how the creator of the part wants it to respond to changes and updates. For example, the hole at the top of a beverage should stay at the top surface, regardless of the height or size of the can. SOLIDWORKS can specify that the hole is a feature on the top surface, and will maintain that design intent no matter what the height is later given to the can. Features refer to the building blocks of the part, they are the shapes and operations that construct the part. Shape-based features typically begin with a two-dimensional or three-dimensional sketch of shapes such as bosses, holes, slots, etc. This shape is then extruded or cut to add or remove material from the part. Operation-based features are not sketch-based, and include features such as fillets, chamfers, shells, applying draft to the faces of a part, etc.

Building a model in SOLIDWORKS starts with a two-dimensional or three-dimensional sketch with points, lines, arcs, conics, and splines. Dimensions are added to the sketch to define the size and location of the geometry. Relations are used to define attributes such as tangency, parallelism, perpendicularity, and concentricity. The parametric nature of SOLIDWORKS means that the dimensions and relations drive the geometry, not the other way around. The dimensions in the sketch can be controlled independently, or by relationships to other parameters inside or outside of the sketch. SOLIDWORKS allows a user to roll back through the history of the part in order to make changes, add additional features, or change the sequence in which operations are performed.

In an assembly, sketch relations are matched, mates define equivalent relations with respect to the individual parts or components, allowing the construction of assemblies. SOLIDWORKS also includes mating features, such as gear and cam follower mates. This allows modeled gear assemblies, for example, to reproduce the rotational movement of a gear train. Drawings can be created either from parts or assemblies. Views are automatically generated from the solid model, and notes, dimensions and tolerances can then be added to the drawing as needed.

MillLister, Inc. (Chatsworth, Calif.) provides bill of materials (BOM), cut-list, mill list, and feature recognition detailing software and services with their SMARTLISTER, SMARTMODELING, and SMARTMACHINING that support AutoCAD®. SOLIDWORKS and others require complex formulas and parameters that drive the graphics on the screen. For cut-list or output to a computer numeric control (CNC) machine, the exported data is calculated from a formula database created by the user. If there is no formula, then there is no data to export. Complicated assemblies are therefore difficult and time consuming, if not impossible. The programming required yields quick, but simplistic results.

SMARTLISTER is a computerized orientation method that automatically extracts the three bounding box size values of CAD objects and then copies the values into the appropriate length, width and thickness columns of a grid or table. The process uses data stored in an orientation tag of three defined positions and three defined variables and compares the three bounding box distance values to each other. See, U.S. Pat. No. 6,928,331, issued Aug. 9, 2005, to David Robert Wishengrad.

SMARTLISTER measures and feature-recognizes the graphics on the screen. After drawing it in three-dimensional, SMARTLISTER generates the manufacturing data. No matter how complicated the assemblies become, the process is always easy, fast and straight-forward. The user only needs to know how to actually build the pieces in the shop and then draw it in three-dimensional.

SMARTLISTER automatically measures selected three-dimensional AutoCAD® solids and then creates bill of materials, cut-lists, mill lists, and CNC-ready DXF files. When SmartModeling is bundled with SmartLister, multiple three-dimensional solids and assemblies can be stretched in one operation, as well as move, copy, erase, mirror, array and copy-rotate multiple holes in multiple solids in one operation.

SUMMARY OF THE INVENTION

Briefly, a design and building system embodiment of the present invention comprises software and hardware components that attach to an otherwise standard computer system running WINDOWS, AUTOCAD, or mechanical CAD software program operating and application programs. The software erects a network forum through a network adapter and Internet connection to the computer system. The network forum provides an interactive and simultaneous mechanism for owners, clients, structural engineers, architects, project managers, prime contractors, sub-contractors, and building services to cooperatively carry a project from concept to completion on-line using three-dimensional modeling. The users begin by drawing the project concept on the screen in two-dimensions with non-parametric based software. The software measures and feature-recognizes the graphic and converts it to three-dimensions, and manufacturing data is immediately available. The users draw the pieces as they will actually build the pieces in the shop.

These and other objects and advantages of the present invention will no doubt become obvious to those of ordinary skill in the art after having read the following detailed description of the preferred embodiments that are illustrated in the various drawing figures.

IN THE DRAWINGS

Figure 3:
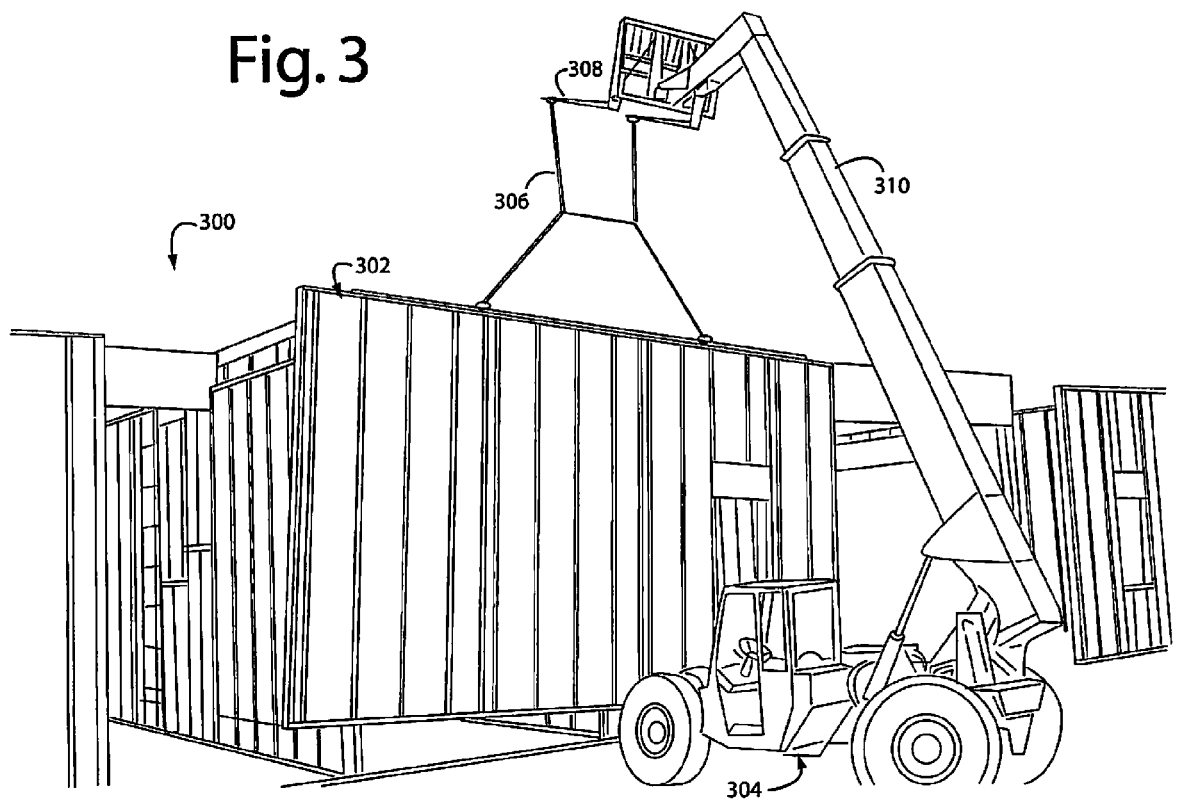

FIG. 3 is perspective view diagram of a building embodiment of the present invention that uses pre-assembled EPS and steel wall panels in its envelope and telescoping boom forklifts in its construction; and FIG. 4 is an exploded assembly diagram in a perspective view showing how a typical wall panel embodiment of the present invention is assembled at the factory before being delivered to a jobsite.

DETAILED DESCRIPTION OF THE PREFERRED EMBODIMENT

Figure 1:
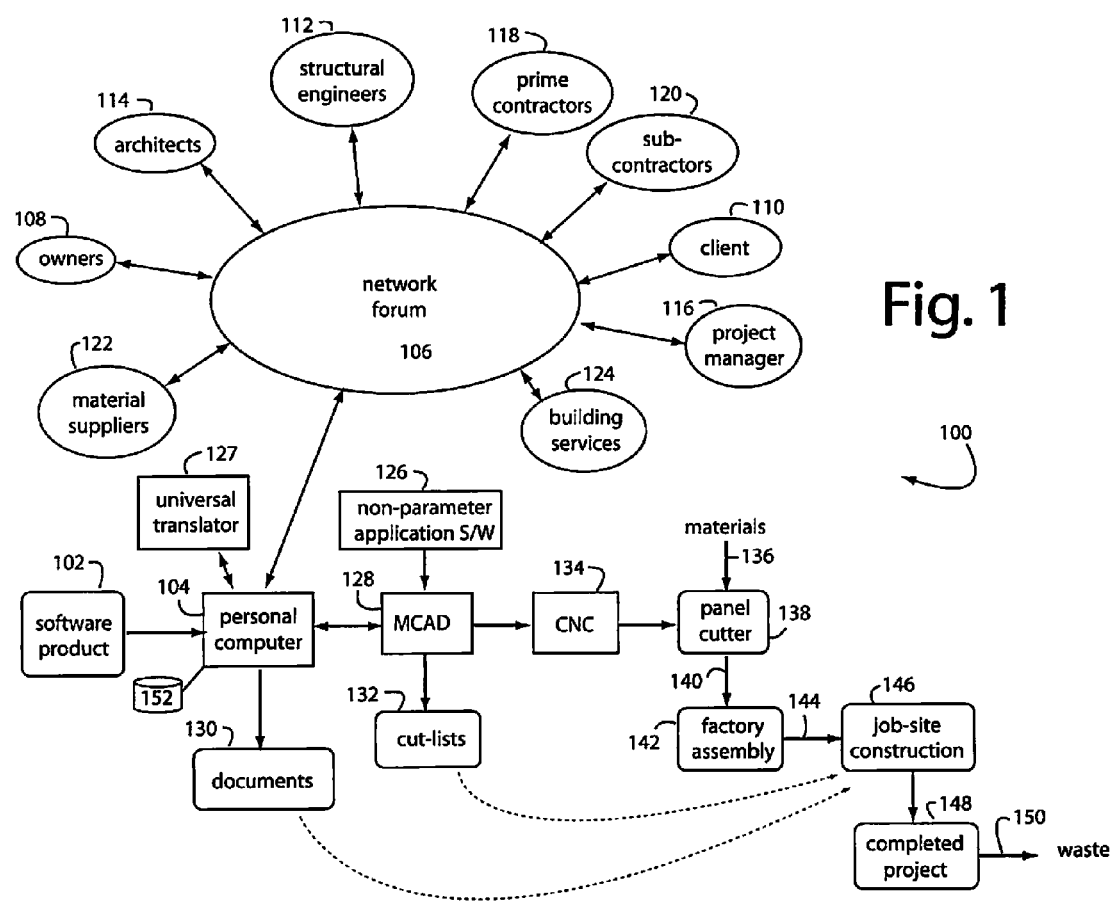
FIG. 1 is a functional block diagram of a building design and construction system embodiment of the present invention.

FIG. 1 represents a building design and construction system embodiment of the present invention, and is referred to herein by the general reference numeral 100. System 100 comprises software and hardware components that attach to an otherwise standard computer system running mechanical CAD software application programs. A software product 102 purchased by the user is loaded on a personal computer 104. The executed program erects a network forum 106 through a network adapter and Internet connection. The network forum 106 provides an interactive and simultaneous mechanism for several project contributors, e.g., owners 108, clients 110, structural engineers 112, architects 114, project managers 116, prime contractors 118, sub-contractors 120, material suppliers 122, and building services 124 to cooperatively carry out a project from concept to completion on-line using three-dimensional modeling.

A universal translator 127 is employed that allows the several contributors in the forum 106 to use their own design automation tools and still work interactively with all the others on the project design. For example, such universal translator 127 translates between industry standard file formats and protocols like DXF, DWFX, DOCX, PPTX, PNG, BMP, AVI, PDF, RTF, SEMBLIO, JTX, XPS, XLSX, XML, ZIP, etc. Industry Foundation Classes (IFC/ifcXML), are open specifications for Building Information Modeling (BIM), and are used to share and exchange BIM in a neutral format among various software applications. The Green Building XML schema (GBxml) facilitates a common interoperability model integrating many design and development tools used in the building industry. GBxml is widely integrated into a range of software CAD and engineering tools.

The users of system 100 begin a project by drawing the project concept on the screen in two-dimensions with a non-parametric based BIM software 126. For example, such software 126 may comprise commercially available SMARTLISTER that has been enhanced with custom made libraries and macros tailored for the uses described here. Parametric files are not used to create the drawings in the first place. Instead, software 126 uses the drawings to precipitate the relevant parameters that are then fed to an MCAD program 128, like AutoCAD. This is approach is significant in that drawings can be done more intuitively with software 126 than parameters can be entered manually with MCAD program 128.

The MCAD program 128 interacts with the non-parametric based BIM software 126 to simplify the design process, and will usually include a database attached to computer 104. BIM software 126 may be included in the system software 102.

Software 126 operates to quantify the project drawings. All objects are created in MCAD program 128, AutoCAD, using it as a three-dimension electronic drafting table. Software 126 processes the objects' points and poly-lines in space and measures the relative distances amongst them. It returns the length, width, and thickness of each 3D solid object and organizes them into a spreadsheet grid. The 3D objects can be quantified and organized by the user as desired.

Software 126 also operates to automated drawing and code generation. Algorithms and macros are included in software 126 to break down the roof and wall frame solids into EPS foam and steel stud panels that can be cut by CNC machine 134. The automated routines provide feature recognition for the objects created, and allow automated tool-pathing, e.g., the logic required to have CNC machine 134 cut the shapes defined by the 3D project drawings. Thus, software 126 measures and feature-recognizes the graphics drawn on screen by the project contributors and converts two-dimensional graphics into three-dimensional representations. Software 126 automatically makes manufacturing data available, such as documents 130 and cut-lists 132.

In general, building information modeling (BIM) describes the geometry, spatial relationships, geographic information, quantities and properties of building components. BIM software 126 is able to display the processes of construction and facility operation during the entire building life cycle. The quantities and shared properties of materials can be exported. The scope of work can be isolated and defined. Systems, assemblies, and sequences are able to be shown in a relative scale with the entire facility or group of facilities.

BIM software 126 models the actual parts and pieces used in a project to build a building. This is a substantial shift from the traditional computer aided drafting method of drawing with vector file based lines that combine to represent objects. The interoperability requirements of construction documents include the drawings, procurement details, environmental conditions, submittal processes and other specifications for building quality. BIM software 126 can be used to avoid the information losses usually associated with handling a large project. Each user can add to and reference back to information they acquire during their period of contribution to the BIM project model. For example, rather than going to and exploring the physical building, the engineer 112 may turn to the BIM project display through network forum 106 to see if a water valve, for example, is located at a particular location. The BIM project model may include the specific valve size, manufacturer, part number, and other information contributed in the past.

The American Institute of Architects defines BIM as a model-based technology linked with a database of project information. This reflects the general reliance on database technology as the foundation. In the future, structured text documents such as specifications may be able to be searched and linked to regional, national, and international standards.

In general, BIM provides a virtual information model to be handed from design team (architects, surveyors, consulting engineers, and others) to contractor and subcontractors and then to the owner, each adding their own additional discipline-specific knowledge and tracking of changes to the single model. The result greatly reduces the information loss that occurs when a new team takes over the project. BIM can deliver information far beyond that which is possible in conventional systems.

BIM methods and tools are used to greatly decrease errors made by the design and the construction teams through the use of conflict detection. Computer 104 informs team members about design parts of the building in conflict using detailed computer visualizations of each part in relation to the whole. Such error reduction provides cost savings realized by all members of a project. Reduction in time required to complete construction directly contributes to the cost savings numbers as well. Such benefits depend on the models being sufficiently developed in the design development stages.

BIM is a computer aided design (CAD) paradigm that allows for intelligent, 3D and parametric object-based design. Commercial examples of parametric based BIM software include Bentley Architecture V8i from Bentley Systems, Inc. (Exton, Pa.) and Autodesk Revit from Autodesk, Inc. (San Rafael, Calif.). Bentley Architecture is part of an integrated suite of BIM applications that provide seamless integration between design, engineering, analysis, construction, and operations for the entire lifecycle of facilities. It supports multi-disciplinary workgroups and global teams in a managed environment, allowing them to build as one. Autodesk Revit is a Building. Information Modeling software for Microsoft Windows, and allows a user to design with parametric modeling and drafting-elements. Revit provides full bi-directional associativity. A change anywhere is a change everywhere, instantly, with no user interaction to manually update any view. BIM models span a building's full life cycle, from concept, to construction, and to decommissioning. An underlying relational database architecture includes a so-called parametric change engine.

So-called 4D-BIM includes scheduling, and so-called 5D-BIM further includes cost information. The project designs are developed as a digital database 152 rather than a series of separate documents. Database 152 is a central store of all the physical and functional characteristics of the construction project. Documents are still useful, but the drawings and lists are generated on demand from the database. The advantage is the database 152 represents the most current, shared understanding of the project. Documents are not the primary, core representation of the project. Instead, database 152 is the authority at any instant. It is a shared resource for reliable, collaborative decision making across the network forum 106. Consequently, documents 130 and cut-lists 132 are special-purpose work products generated from database 152 when needed.

In general, a BIM project is not drawn up in the traditional sense, e.g., as lines, arcs and text, nor in multiple documents representing the information about all the elements of the project. Rather, the project is built digitally as a database in BIM software, using intelligent objects that represent every element in a project. The pertinent information is built into the corresponding intelligent object in the BIM. Each object then provides the links to all the information about itself.

Once an object is placed in BIM, it automatically represents itself in every plan, elevation, section, detail, schedule, 3D rendering, quantity takeoff, budget, maintenance plan, and other sheets that involve its use. As a design changes, affected objects adapt themselves parametrically to the new design. All the physical and functional characteristics of a project are related in a database. This provides for the fluid exchange of information between project team members and their technology tools. Process efficiencies and more collaborative design and construction result. Once the project is completed, the database can be used for on-going operations and maintenance.

Industry Foundation Classes (IFC/ifcXML) are open specifications for BIM. They are used to share and exchange BIM in a neutral format among various software applications. The Green Building XML schema (GBxml) facilitates a common interoperability model integrating many design and development tools used in the building industry. GBxml integrated into a range of software CAD and engineering tools reduces the time to develop a building. It also assures that when the building is put to use, it will meet the design intent. Software product 102 may be embodied on disk or as a downloadable file that executes a building design program on a standard host computer 104 equipped, e.g., with Microsoft WINDOWS operating system. Such computer 104 may also host a user's other commercial design and management software. MCAD program 128 provides for interactive three-dimensional modeling and design amongst the several contributors. A fully detailed and approved design can be completed before cut-lists 132 or, e.g., drawing exchange format (DXF) type or G-Code files are sent out to a computer numeric control (CNC) machine 134.

The programming language of Numerical Control (NC) is sometimes informally called G-code. But in actuality, G-codes are only a part of the NC-programming language that controls NC and CNC machine tools. A final revision is approved in February 1980 as RS-274D. In Europe, the standard DIN 66025/ISO 6983 is often used instead. DXF is tagged data format, each data element in the file is preceded by an integer number that is called a group code. A group code value indicates the type of data element and the meaning of a data element for a given object or record type. Practically all the user-specified information in drawing files can be represented in DXF format.

Two-dimensional views of the project can be printed as documents 130 for approvals, permit applications, contractors, workers, and suppliers. Otherwise, three-dimensional views are presented on computer screens at the several contributor remote sites connected to network forum 106, and these can be iterated and advanced by all in parallel with the latest modifications appearing instantly. Such network forum 106 allows compromises in the design to be negotiated before any labor or material are committed or wasted due to changes.

CNC machine 134 takes in raw blocks of expanded polystyrene (EPS) and steel angle and stud material 136, and cuts and shapes them in a panel cutter 138 according to the design and cut-list 132. The cut pieces 140 of EPS and steel are assembled with long fasteners in the factory 142 and marked with identifying numbers for job-site assembly. The prepared pieces 144 are shipped to the job-site construction 146 and assembled into a whole building shell according to documents 130. A completed job 148 results with very little or no waste 150 because mistakes in cutting and materials ordering are so tightly limited to that necessary for the final design arrived at by consensus of all contributors.

Software 102 automates the design management, and fabrication of modern buildings such that a substantial cost savings is realized. The EPS and steel panels combine into structural shells that significantly reduce heat loss or gain in highly insulated buildings that have a near net-zero carbon footprint.

Software 102 produces a parallel-approved consensus representing every joist, plate, fixture, and fastener comprising a building that has been built and modeled in electronic space for review and iteration by every participant from owner to county planner. It does not just provide a three-dimensional picture. It is a multi-dimensional rendering tool that insists that every part must fit perfectly. Even one apparently simple change can impact all of the interfacing structures, so all the consequential changes are immediately visible to the entire team from owner to construction foreman. And each contributor is free to make further comments and adjustments to accommodate the new changes.

System 100 includes software tools to design and engineer building structures and provide a list of all of the materials needed to be purchased and delivered to the job site. Automated fabrication technologies fabricate the wall and roof structures from expanded polystyrene foam panels (EPS) with integrated, but thermally isolated metal studs. The panels replace conventional framed walls, essentially encasing buildings in the equivalent of a big thick Styrofoam cooler. The heat loss of such buildings is typically a fraction of conventional designs. The architecture of each building is computer modeled, allowing the design to be iterated through engineering. The full cut-list of every piece generated after the design is settled, and the prefabricated thermally insulated wall and roof panels can be constructed in the factory 142 and delivered to the job site 146. The minimized errors and waste directly aids green building construction and profits.

System 100 co-manages the construction process and provides energy efficient alternatives by inputting data in its usual disparate languages and translating to a multidimensional model of structures and subsystem elements that everyone can understand and iterate. For example, one end-product includes two-dimensional approval documents 130, copies for the trades-people, bills of materials, and cut-lists 132 for use by staff in purchasing and fabrication.

Software 102 provides for a building construction process with four basic stages that involve the interaction of at least eight individual specialties. A first stage allows a project owner 108 to choose the type of commercial or residential structure needed. A second stage is site selection, in which architects 114 and engineering firms 112 consider various factors like tax rate, topological land features, and traffic and determine suitability to the owner's objectives. A third stage advances the project from concept to visual reality. Detailed two-dimensional and three-dimensional models are used in cost estimate iterations to build detailed engineering plans and documents 130 that will be needed for government permits and contractor bidding. Once detailed drawings and instructions are completed, the details are consolidated for materials selection and accurate cost estimates and schedules. Network forum 106 enables free and easy communication amongst the large number of sometimes disparate interests.

System 100 automates the construction process by coupling design software and construction management applications to the CAD machine processes, on-site and at a central operation. The design and management software each customer prefers is integrated with a data base for seamless electronic data exchanges. Individual and work group participants can access all data remotely.

Engineering drawings and other data are available to all of the participants in the decision process from beginning to end. Any changes are subject to approval by all participants in a parallel process by remote access to the system 100 that, in turn, consolidates and translates all inputs to a common language. All of the hardware designed for the project, down to the last small bracket, is numbered and displayed at its use point in expandable three-dimensional illustrations. This aids in keeping on-site labor costs to a minimum and minimizing on-site waste 150.

EPS is preferred as the core wall and roof material. Optimizing material selection is a key component in building "green," and EPS is an environmentally responsible alternative to other types of building insulation. EPS ranks well in most of the key attributes of a "green" building material, such as, recycled and/or recovered content, reusability/recyclability, durability, embodied energy, and air quality. Virtually all in-plant scrap can be recycled and re-used in the primary extrusion process, thus resulting in very high material utilization.

The increasing costs of material disposal and land filling make the re-usability of EPS attractive. EPS building insulation reduces energy consumption, while increasing the comfort level of occupants compared to under-insulated buildings. The attributes of EPS, stable and high R-value, moisture resistance, and high compressive strength, make it choice material for wall and roof construction.

In conventional framing, fiberglass batt insulation's thermal resistance values can be 26 hr-Ft$^2$-0F/Btu, or higher. But the much lower low thermal resistance of the studs, sill plates and top plates short circuit that to about half the net effective value of the wall. Wall and roof panels 140 are constructed to take advantage of the high thermal resistance of EPS foam, and the steel studs are not thermally connected between the inside and outside, thereby eliminating shunt heat losses.

Convection, radiation, and moisture absorption are further concerns. Buildings designed and constructed using system 100 have a very low permeability rate, and a high resistance to air and water penetration. Controlling air infiltration and restricting the natural tendency of warm air to move toward cold air as well as shedding water are very effectively managed by the inherent advantages of EPS.

Figure 2:
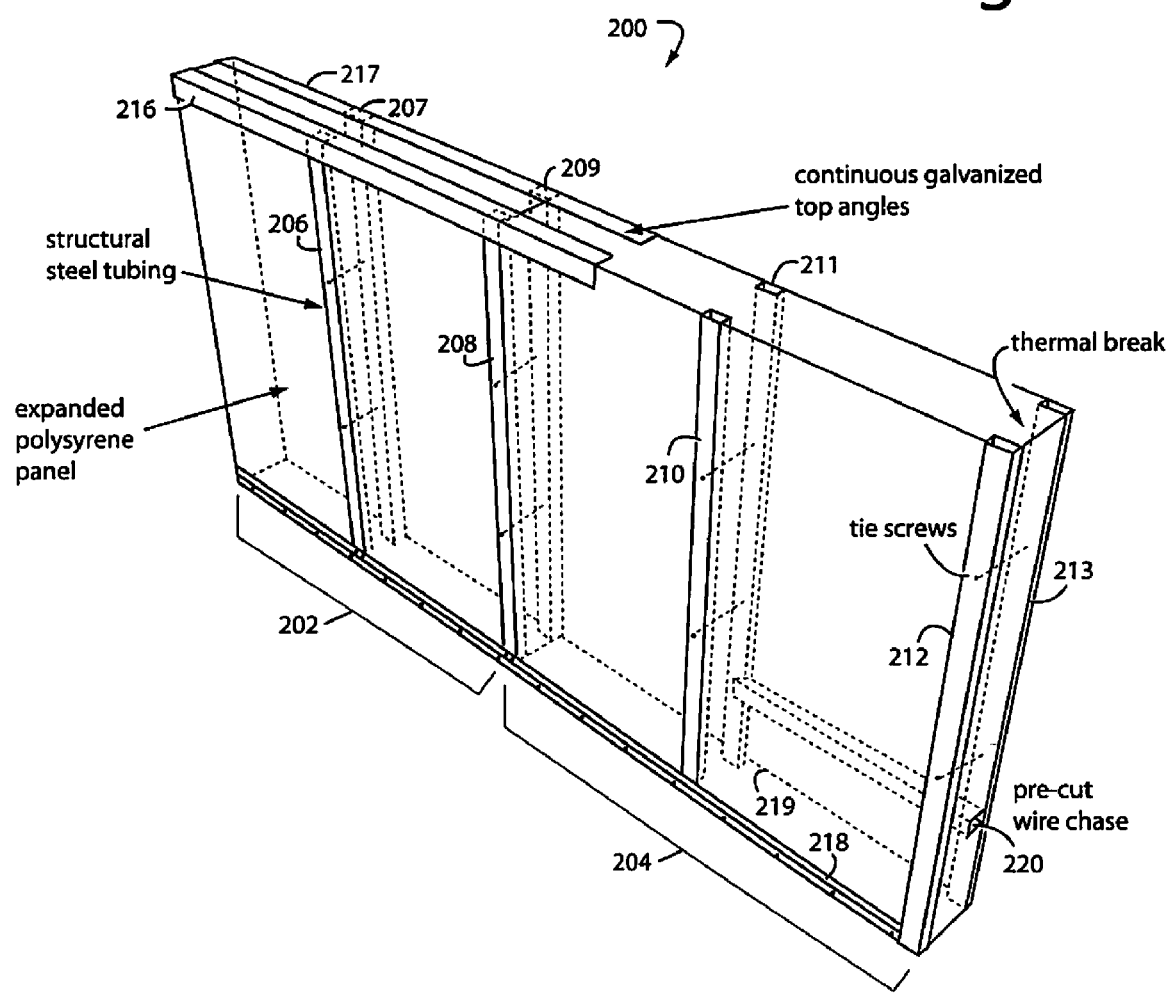
FIG. 2 is perspective view diagram of a typical wall panel embodiment of the present invention.

FIG. 2 represents a typical wall panel 200, in an embodiment of the present invention, after factory assembly 142. Two pieces of EPS foam 202 and 204 may be about 7.25" thick and cut to shape and slotted by CNC machine 134 and panel cutter 138 for studs 206-213. These studs are typically 1"×2" G-90 16-gauge tubular steel and fastened together with 7" #12 tie screws between adjacent studs on opposite sides. A pair of top angles 216 and 217 fastened to studs 206-209, and a pair of bottom angles 218-219 are fastened to studs 206-213. A wire chase 220, e.g., 2"×1½", may be slotted horizontally by CNC machine 134 and panel cutter 138, or at the jobsite by an electrician using a shaped hot-wire mounted in a Weller D550-type electric soldering gun.

Roof panels are similar to wall panel 200, only the EPS foam is much thicker, e.g., 12". In homes constructed with such EPS foam wall and roof panels, the interior walls and flooring may be conventional wood framing with plywood and sheetrock.

Advantages of embodiments of the present invention include reduced liability claims, affordability thru interoperability enhancement, conversion of design/bid/build silo to continuum, quality of information (from two-dimensional drawings to electronic interoperable storage), manufacturing automation of low heat loss wall and roof systems, low carbon footprint buildings, material cost savings, and reduced waste. System 100 provides products and services for sustainable building design and construction, e.g., thermally efficient wall and roof systems as well as the services that translate conventional two-dimensional drawings and specifications to interoperable three-dimensional digital prototypes.

The redesigns are ported directly to machine language, then cut and assembled using automated manufacturing technologies that readily enable custom home amenities and efficiencies. Proportionate efficiency advantages are also evident in system 100 services and materials for commercial buildings.

Unlike conventional structural insulated panels (SIPS), system 100 wall systems limit heat transfer by not thermally bridging the outside and inside surfaces with efficient heat conductors. A 5.25" thermal break of EPS is typical. The EPS and steel materials used are recyclable, do not provide food or habitat for termites and other insects, are stronger that wood and fiberglass batt alternatives, and generally reduce heating and cooling costs to a fraction of conventional construction techniques.

Roof systems can use the same materials and manufacturing technologies as the wall systems, except they are generally twelve inches thick. System 100 roofs are non-hygroscopic and do not readily absorb moisture from the atmosphere. They achieve very high and very stable thermal resistances. When EPS is used in wall systems the entire building envelope is very tight and the overall heat loss resulting from window and door fenestrations is typically reduced. System 100 software delivers electronically accessible drawings and a cut-list of the project thereby simplifying the entire material acquisition process. The process of converting to three-dimensional computer models resembling building on the site make conflicts or other errors become apparent and correctable before any materials and people are committed. The design being available on line to all of the participants from architect to owner in real-time thereby providing for each of their input and feedback.

The essence of green building is to create structures that are efficient in their consumption of energy and water and not wasteful in use of materials. System 100 addresses this in a number of ways. One is the fact that the modular roof and wall panels are made from expanded polystyrene (EPS) and light gauge steel. EPS is light weight, approximately 98% air and 2% polystyrene by volume, and highly energy efficient. Interlockable panels can easily be assembled and disassembled and due to their inert nature and longevity can be repeatedly reused, rather than needing to go into landfill. The light weight panels and other building materials also reduce transport cost over that required for conventional construction materials, adding to a minimization of greenhouse gases.

The fact that software 102 builds a shell in three-dimensions once a design has been completed, and every component is labeled and cutting lists are produced for all elements of the structure and finish, results in minimizing waste. The interlocking panel systems ensure quick and easy installations. The result is an overall efficiency that reduces costs relative to that of conventional construction. Proper use of the software in the design stage will also enable identification of problems upfront, eliminating them from the costly building phase. Other benefits to the EPS panel construction include low flammability properties compared to timber construction.

FIG. 3 represents a building 300 with an envelope of exterior walls principally comprising pre-assembled wall panels designed and constructed by system 100. An assembled wall panel 302, in an embodiment of the present invention, is shown being lifted into place by a telescopic boom forklift 304 or other light gauge equipment. A sling 306 is suspended from a pair of forks 308 at the end of a hydraulic boom 310. Such use of a telescopic boom forklift 304 helps avoid the costs and complexity involved with bringing a conventional crane onto a small jobsite. The assembled wall panel 302 essentially comprises milled blocks of expanded polystyrene foam with tubular steel studs and sheet metal top and bottom caps. Such wall panel construction is detailed more fully in FIGS. 2 and 4.

FIG. 4 represents a wall panel 400 that is constructed of several expanded polystyrene foam panels, e.g., 402 and 404. Each expanded polystyrene foam panel 404 is milled in a CNC machine 134 (FIG. 1) according to a design finalized electronically by the various project contributors 108-120. The basic construction technique used here is to inset tubular steel studs 410-413 and to cap them at the top and bottom with corner angles 416-418 made of sheet metal. The pieces are assembled at the factory using adhesives and screws, before being delivered to a jobsite. The tubular steel studs 410-413 are cut to length at the factory and marked with identifying placement numbers by the same design that is finalized electronically.

A CNC machine, like CNC machine 134 (FIG. 1), receives a design and commands from an MCAD program, like MCAD 128, to mill out slots and channels in expanded polystyrene foam panel 404. A panel cutter, such as 138, uses routers on X-Y plotters on both sides to mill out wiring chase 420 and stud slots 422-425. A CNC machine can also be employed to cut studs 411-413, or they may be cut manually by a saw operator using a print out of a cut list 132 (FIG. 1). The panel cutter may also be equipped with hot wires or bandsaws to cut the outside dimensions of the EPS panels. When many studs are all cut to the same size, the studs can be marked and placed in inventory to be drawn out and used later.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

The invention claimed is:

1. A building construction system, comprising:
a non-transitory computer-readable medium comprising computer-implemented instructions for designing expanding polystyrene foam panels for forming an envelope of a building and for generating a plan with reference numbers to identify component pieces of said building;
a computer aided design (CAD) program for generating computer numerical controlled (CNC) milling commands for said expanded polystyrene foam panels, and a cut-list for steel reinforcing studs to fit into matching slots milled into said expanded polystyrene foam panels; and
a device for marking at least said expanded polystyrene foam panels and matching steel reinforcing studs with identifying numbers corresponding to said reference marks.

2. The system of claim 1, further comprising:
a command interface for a computer numerical controlled (CNC) machine providing for milling said expanded polystyrene foam panels according to said CNC milling commands from the CAD program.

3. A method of building construction, comprising:
designing a building with software for execution on a computer such that an envelope of said building principally comprises expanded polystyrene foam panels, and said software is used to automatically generate a plan with reference numbers that identify substantially all component pieces of said building;
coupling said software and computer to a computer aided design (CAD) program for generating computer numerical controlled (CNC) milling commands for said expanded polystyrene foam panels, and a cut-list for steel reinforcing studs to fit into matching slots milled into said expanded polystyrene foam panels;
marking at least said expanded polystyrene foam panels and matching steel reinforcing studs with identifying numbers corresponding to said reference numbers; and
milling said expanded polystyrene foam panels with a computer numerical controlled (CNC) machine according to said CNC milling commands from the CAD program.

4. The method of claim 3, further comprising:
assembling said expanded polystyrene foam panels and matching steel reinforcing studs together with identifying numbers corresponding to said reference numbers.

5. The method of claim 3, further comprising:
detecting an error in assembling said expanded polystyrene foam panels and matching steel reinforcing studs when pieces with said identifying numbers do not apparently fit together.

6. The method of claim 3, further comprising:
electronically connecting together remote sites over a computer network such that a plurality of parties involved in design and approval of said building can interactively, cooperatively, and simultaneously advance said design and approval of said building.

7. The method of claim 3, further comprising:
using light gauge equipment instead of a crane to lift and place pre-assembled expanded polystyrene foam panels and matching steel reinforcing studs at a jobsite.

8. A building construction system, comprising:
a computer;
a computer-readable medium comprising instructions implemented by said computer for designing expanded polystyrene (EPS) foam panels for forming an envelope of a building and for generating a plan with reference numbers to identify component pieces of said building;
a computer aided design (CAD) program in communication with the computer for generating computer numerical controlled (CNC) milling commands for said expanded polystyrene foam panels, and a cut-list for steel reinforcing studs to fit into matching slots milled into said expanded polystyrene foam panels;
a device for marking at least said expanded polystyrene foam panels and matching steel reinforcing studs and identifying numbers corresponding to said reference numbers; and
a command interface for a computer numerical controlled (CNC) machine providing for milling said expanded polystyrene foam panels according to said CNC milling commands from the CAD program.

9. The building construction system of claim 8, further comprising:
a network interface for electronically connecting together remote sites over a computer network such that a plurality of parties involved in design and approval of said building can interactively, cooperatively, and simultaneously advance a design and approval of said building.

10. The building construction system of claim 8, further comprising:
a panel cutter with routers on X-Y plotters on both sides to mill out wiring chases and stud slots, and further including hot wires or bandsaws to cut the outside dimensions of said EPS foam panels.

* * * * *